US010068802B2

(12) United States Patent
Eshun et al.

(10) Patent No.: US 10,068,802 B2
(45) Date of Patent: Sep. 4, 2018

(54) THRESHOLD MISMATCH AND IDDQ REDUCTION USING SPLIT CARBON CO-IMPLANTATION

(71) Applicant: Texas Instruments Incorporated, Dallas, TX (US)

(72) Inventors: Ebenezer Eshun, Plano, TX (US); Himadri Sekhar Pal, Allen, TX (US); Amitabh Jain, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 280 days.

(21) Appl. No.: 13/654,161

(22) Filed: Oct. 17, 2012

(65) Prior Publication Data

US 2013/0095630 A1    Apr. 18, 2013

Related U.S. Application Data

(60) Provisional application No. 61/547,939, filed on Oct. 17, 2011.

(51) Int. Cl.
H01L 21/8234 (2006.01)
H01L 21/265 (2006.01)
H01L 29/66 (2006.01)
H01L 29/78 (2006.01)

(52) U.S. Cl.
CPC ........ *H01L 21/823412* (2013.01); *H01L 21/26506* (2013.01); *H01L 21/26513* (2013.01); *H01L 21/26586* (2013.01); *H01L 21/823418* (2013.01); *H01L 29/6659* (2013.01); *H01L 29/66537* (2013.01); *H01L 29/7833* (2013.01)

(58) Field of Classification Search
USPC ............... 438/275, 276, 278, 302, 520, 525
See application file for complete search history.

(56) References Cited

U.S. PATENT DOCUMENTS

| 7,573,095 | B2 * | 8/2009 | Lee et al. ................ 257/326 |
| 7,592,243 | B2 * | 9/2009 | Momiyama ....... H01L 21/26506 257/E21.343 |
| 7,888,223 | B2 * | 2/2011 | Lee et al. ................ 438/306 |
| 8,877,597 | B2 * | 11/2014 | Heinrich ........... H01L 21/28518 257/288 |
| 2007/0252205 | A1 * | 11/2007 | Hoentschel et al. ......... 257/347 |
| 2010/0003798 | A1 * | 1/2010 | Ohta et al. ............... 438/302 |
| 2010/0105185 | A1 * | 4/2010 | Ku et al. ................ 438/301 |
| 2010/0279479 | A1 * | 11/2010 | Hatem et al. ............ 438/300 |
| 2012/0083090 | A1 * | 4/2012 | Tsai et al. ............... 438/302 |

* cited by examiner

Primary Examiner — Bryan Junge
(74) Attorney, Agent, or Firm — Jacqueline J. Garner; Charles A. Brill; Frank D. Cimino

(57) ABSTRACT

An integrated circuit containing MOS transistors may be formed using a split carbon co-implantation. The split carbon co-implant includes an angled carbon implant and a zero-degree carbon implant that is substantially perpendicular to a top surface of the integrated circuit. The split carbon co-implant is done at the LDD and halo implant steps.

20 Claims, 10 Drawing Sheets

THRESHOLD MISMATCH AND IDDQ REDUCTION USING SPLIT CARBON CO-IMPLANTATION

CROSS-REFERENCE TO RELATED APPLICATIONS

This application claims the benefit of priority under U.S.C. § 119(e) of U.S. Provisional Application 61/547,939, filed Oct. 17, 2011.

FIELD OF THE INVENTION

This invention relates to the field of integrated circuits. More particularly, this invention relates to MOS transistors in integrated circuits.

BACKGROUND OF THE INVENTION

An integrated circuit may include N-channel metal oxide semiconductor (NMOS) transistors which are formed concurrently and are used in a variety of circuits, such as static random access memory (SRAM) circuits and low leakage logic circuits. It may be desirable to have less than a certain level of threshold mismatch in NMOS transistors in the SRAM circuits and less than a certain level of leakage current, sometimes referred to as Iddq, in NMOS transistors in the low leakage logic circuits. attaining the desired values of threshold mismatch and Iddq in NMOS transistors formed concurrently may be problematic without adding to fabrication cost and complexity of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing metal oxide semiconductor (MOS) transistors may be formed using split carbon co-implantation at the lightly doped drain (LDD) implant step. The split carbon co-implant includes an angled carbon implant and a zero-degree carbon implant that is substantially perpendicular to a top surface of the integrated circuit. MOS transistors thus formed may provide desired levels of threshold mismatch and Iddq compared to similar transistors formed without carbon co-implantation or only with angled carbon co-implantation.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing MOS transistors may be formed using split carbon co-implantation at the LDD implant step. An exemplary angled carbon implant has an angle of 10 to 35 degrees and a dose of $1 \times 10^{14}$ cm$^{-2}$ to $1 \times 10^{15}$ cm$^{-2}$ at an energy of 3 keV to 12 keV. An exemplary zero-degree carbon implant is substantially perpendicular to a top surface of the integrated circuit, for example within 2 degrees of perpendicular, and has an dose of $1 \times 10^{14}$ cm$^{-2}$ to $8 \times 10^{14}$ cm$^{-2}$ at an energy of 3 keV to 12 keV. The MOS transistors may be n-channel metal oxide semiconductor (NMOS) transistors with boron halo implants, or may be p-channel metal oxide semiconductor (PMOS) transistors with phosphorus halo implants. A portion of the MOS transistors may be covered by an LDD implant mask so as not to receive the split carbon co-implant. MOS transistors thus formed may provide desired levels of threshold mismatch and Iddq compared to similar transistors formed without carbon co-implantation or only with angled carbon co-implantation. For the purposes of this description, angles of implants are given with respect to a perpendicular to the top surface of the integrated circuit.

Figure 1A:
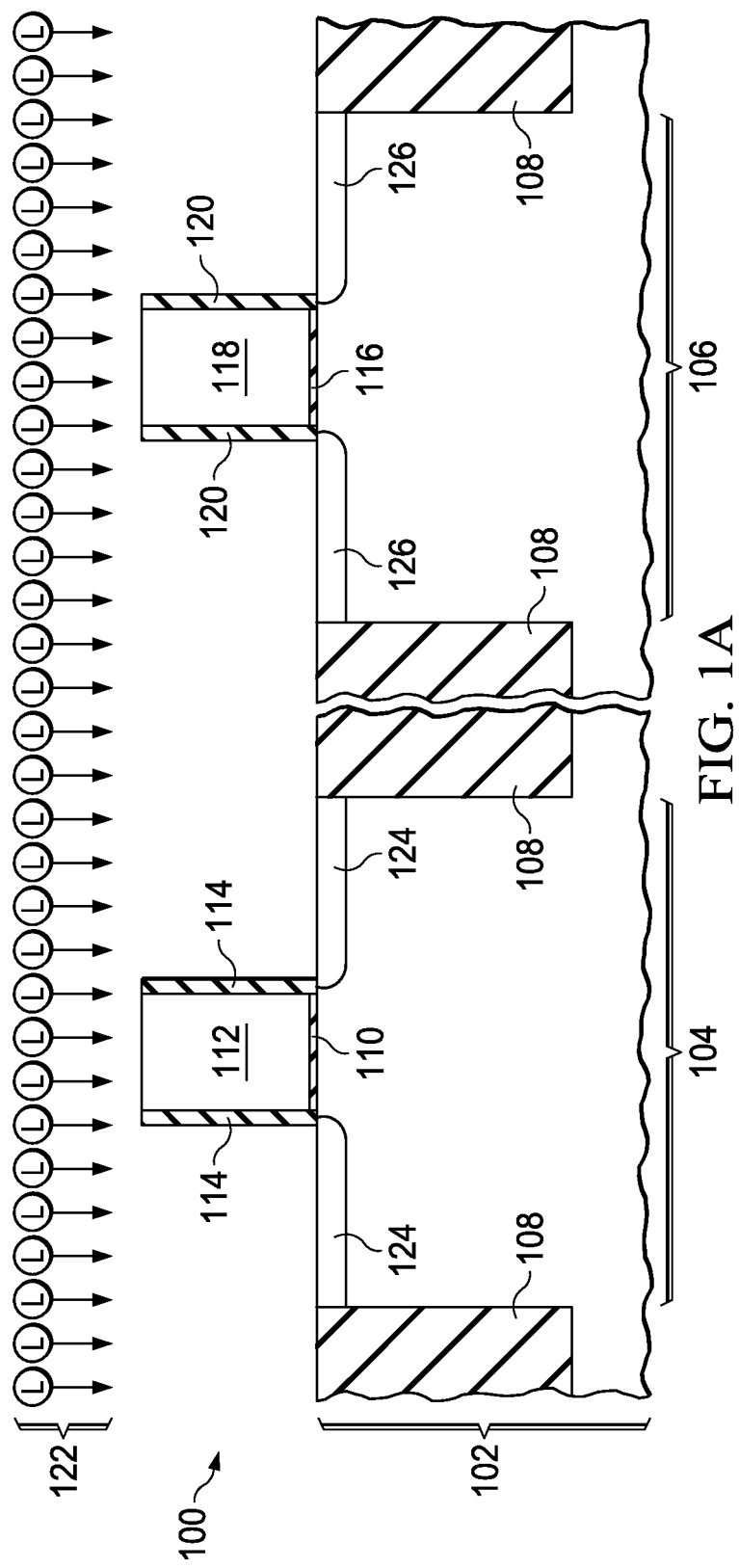
FIG. 1A through FIG. 1D are cross sections of an integrated circuit depicted in successive stages of fabrication.

FIG. 1A through FIG. 1D are cross sections of an integrated circuit depicted in successive stages of fabrication. Referring to FIG. 1A, the integrated circuit 100 is formed in and on a semiconductor substrate 102. The substrate 102 may be, for example, a single crystal silicon wafer, a silicon-on-insulator (SOI) wafer, a hybrid orientation technology (HOT) wafer with regions of different crystal orientations, or other material appropriate for fabrication of the integrated circuit 100. The integrated circuit includes a first MOS transistor 104 which may be used in a circuit requiring a low threshold mismatch, such as an SRAM circuit. The integrated circuit includes a second MOS transistor 106 having a same polarity as the first MOS transistor 104. The second MOS transistor 106 may be used in a circuit requiring a low Iddq, such as a digital oscillator circuit.

Field oxide 108 may be formed at a top surface of the substrate 102 to laterally isolate the first MOS transistor 104 and the second MOS transistor 106. The field oxide 108 may be formed, for example, by a shallow trench isolation (STI) process. An STI process may include the steps of: forming an oxide layer on the substrate 102, forming a silicon nitride layer on the oxide layer, patterning the silicon nitride layer so as to expose an area for the field oxide 108, etching a trench in the substrate 102 in the exposed area to an appropriate depth for a desired thickness of the field oxide 108, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer using a chemical mechanical polish (CMP) operation, and removing the silicon nitride layer.

The first MOS transistor 104 includes a first gate dielectric layer 110 formed at the top surface of the substrate 102 and a first gate 112 formed over the first gate dielectric layer 110. Optional first spacers 114 may be formed on lateral surfaces of the first gate 112. Similarly, the second MOS transistor 106 includes a second gate dielectric layer 116 formed at the top surface of the substrate 102 and a second gate 118 formed over the second gate dielectric layer 116, and may include optional second spacers 120 formed on lateral surfaces of the second gate 118. The first gate dielectric layer 110 and the second gate dielectric layer 116 may be formed concurrently. The first gate 112 and the second gate 118 may be formed concurrently. The first spacers 114 and the second spacers 120 may be formed concurrently.

LDD dopants 122 are implanted into the substrate 102 to form first LDD implanted regions 124 adjacent to the first gate 112 and to form second LDD implanted regions 126 adjacent to the second gate 118. The LDD dopants 122 may be implanted perpendicular to the top surface of the substrate 102. In versions of the instant embodiment in which the first MOS transistor 104 and the second MOS transistor 106 are NMOS transistors, the LDD dopants 122 are n-type dopants such as phosphorus, and/or arsenic, with a total dose, for example of $3 \times 10^{14}$ cm$^{-2}$ to $3 \times 10^{15}$ cm$^{-2}$. In versions of the instant embodiment in which the first MOS transistor 104 and the second MOS transistor 106 are PMOS transistors, the LDD dopants 122 are p-type dopants such as boron, with a total dose, for example of $1 \times 10^{14}$ cm$^{-2}$ to $1 \times 10^{15}$ cm$^{-2}$.

Figure 1B:
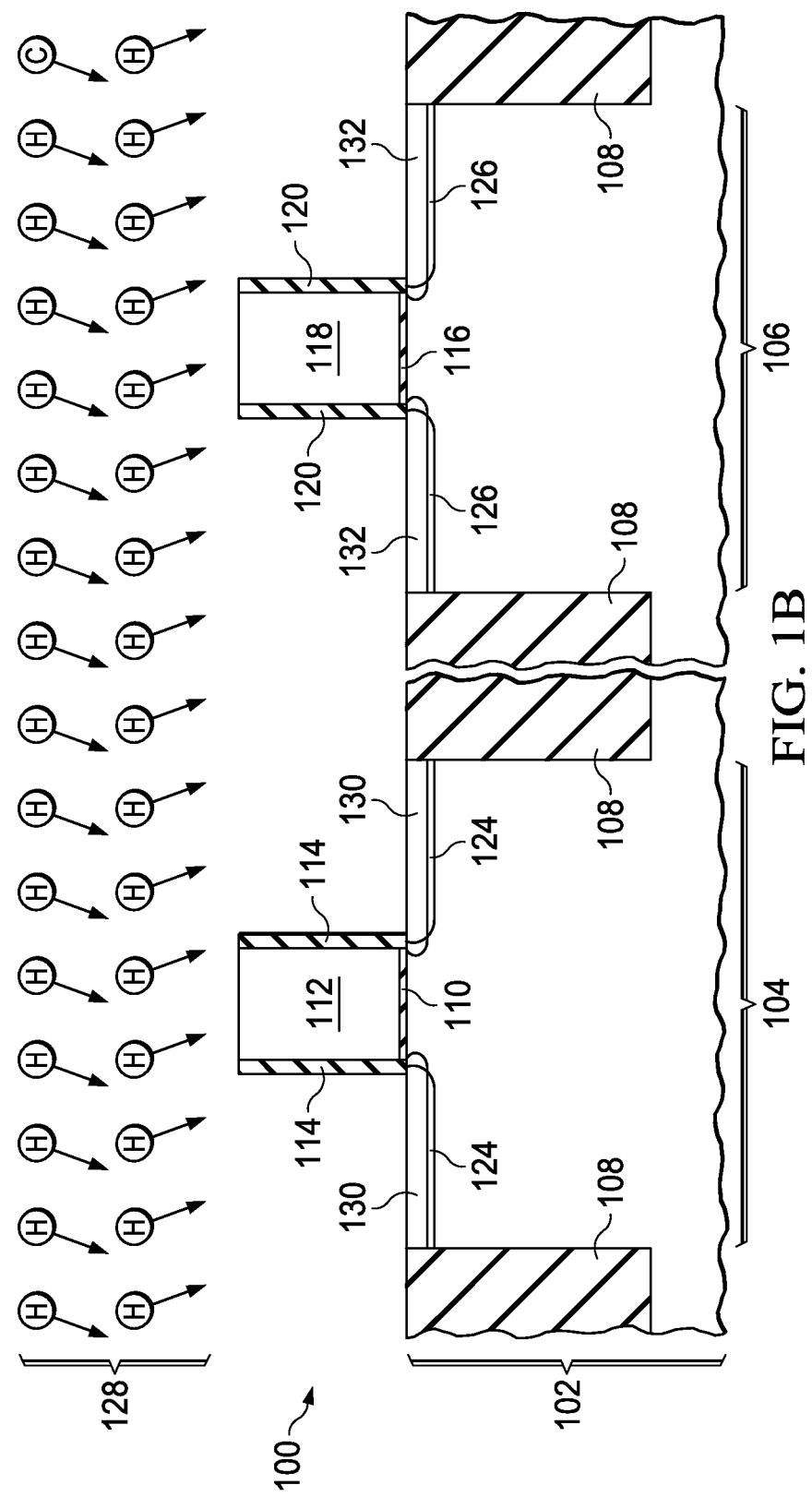

Referring to FIG. 1B, halo dopants 128 are implanted at an angle into the substrate 102 to form first halo implanted regions 130 and second halo implanted regions 132. The first halo implanted regions 130 are adjacent to the first gate 112 and extend past the first LDD implanted regions 124 under the first gate 112 and/or first spacers 114. The second halo implanted regions 132 are adjacent to the second gate 118 and extend past the second LDD implanted regions 126 under the second gate 118 and/or second spacers 120. The halo dopants 128 may be implanted in two or four steps with equal doses, rotated around a perpendicular to the top surface of the substrate 102, so that the first halo implanted regions 130 and second halo implanted regions 132 are substantially symmetric about the first gate 112 and second gate 118, respectively.

In versions of the instant embodiment in which the first MOS transistor 104 and the second MOS transistor 106 are NMOS transistors, the halo dopants 128 are p-type dopants such as boron, with a total dose, for example of $3 \times 10^{13}$ cm$^{-2}$ to $3 \times 10^{14}$ cm$^{-2}$. In versions of the instant embodiment in which the first MOS transistor 104 and the second MOS transistor 106 are PMOS transistors, the halo dopants 128 are n-type dopants such as phosphorus and/or arsenic, with a total dose, for example of $3 \times 10^{13}$ cm$^{-2}$ to $3 \times 10^{14}$ cm$^{-2}$.

Figure 1C:
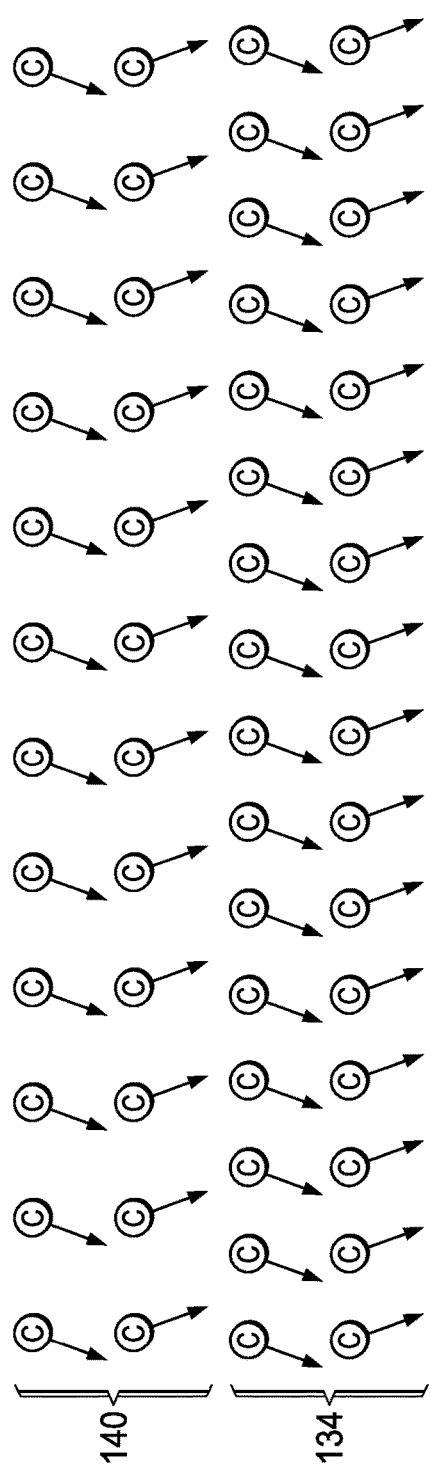
Figure 1C:
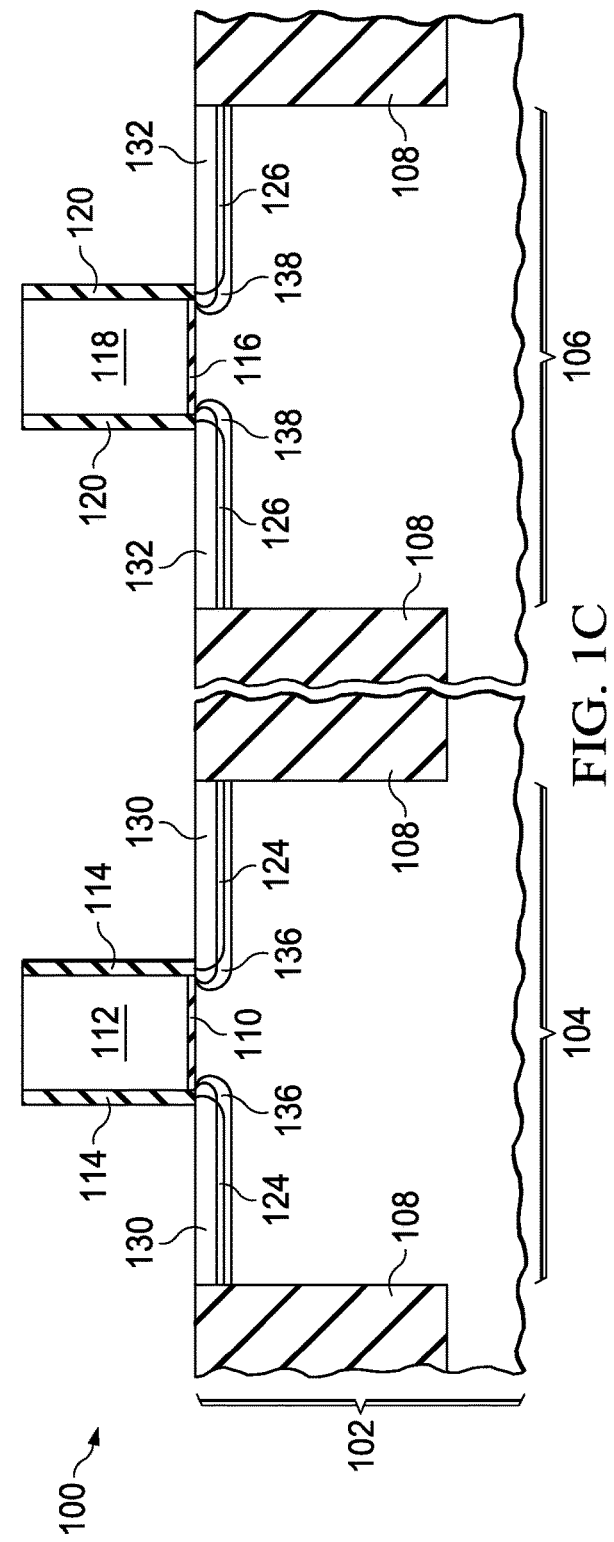

Referring to FIG. 1C, an angled carbon implant is performed in which carbon ions 134 are implanted at an angle of 10 to 35 degrees and a dose of $1 \times 10^{14}$ cm$^{-2}$ to $1 \times 10^{15}$ cm$^{-2}$ at an energy of 3 keV to 12 keV into the substrate 102 to form first angled carbon implanted regions 136 and second angled carbon implanted regions 138. The first angled carbon implanted regions 136 are adjacent to the first gate 112 and extend past the first LDD implanted regions 124 under the first gate 112 and/or first spacers 114. The second angled carbon implanted regions 138 are adjacent to the second gate 118 and extend past the second LDD implanted regions 126 under the second gate 118 and/or second spacers 120. The angled carbon implant may be performed in two or four steps with equal doses, rotated around a perpendicular to the top surface of the substrate 102, so that the first angled carbon implanted regions 136 and the second angled carbon implanted regions 138 are substantially symmetric about the first gate 112 and second gate 118, respectively.

An optional additional angled carbon implant which implants additional carbon ions 140 with a different angle and/or a different dose and/or a different energy may contribute to the first angled carbon implanted regions 136 and the second angled carbon implanted regions 138. The additional angled carbon implant may have, for example a lower dose and higher energy, so as to provide a more gradual carbon profile.

Figure 1D:
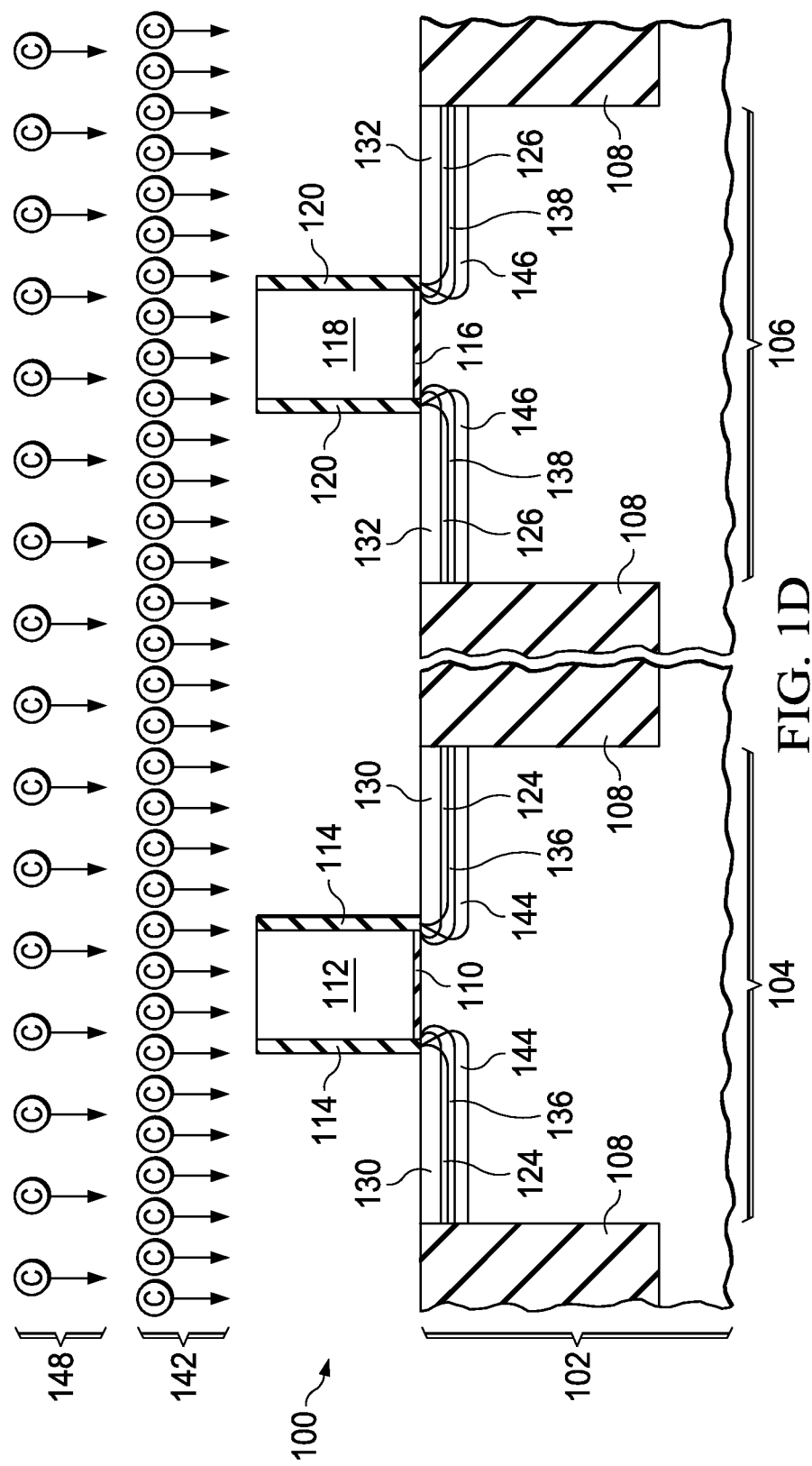

Referring to FIG. 1D, a zero-degree carbon implant is performed in which carbon ions 142 are implanted substantially perpendicular to the top surface of the substrate 102 at a dose of $1 \times 10^{14}$ cm$^{-2}$ to $8 \times 10^{14}$ cm$^{-2}$ at an energy of 3 keV to 12 keV into the substrate 102 to form first non-angled carbon implanted regions 144 and second non-angled carbon implanted regions 146. The first non-angled carbon implanted regions 144 are adjacent to the first gate 112. The second non-angled carbon implanted regions 146 are adjacent to the second gate 118.

An optional additional zero-degree carbon implant which implants additional carbon ions 148 with a different dose and/or a different energy may contribute to the first non-angled carbon implanted regions 144 and the second non-angled carbon implanted regions 146. The additional angled zero-degree implant may have, for example a lower dose and higher energy, so as to provide a more gradual carbon profile.

It will be recognized that the implant operations described in reference to FIG. 1A through FIG. 1D may be performed in another order. Fabrication of the integrated circuit 100 includes one or more anneal operations to activate the dopants in the first LDD implanted regions 124, the second LDD implanted regions 126, the first halo implanted regions 130 and the second halo implanted regions 132. Co-implanting carbon in an angled implant and a zero-degree implant results in portions of the first LDD implanted regions 124 under the first gate 112 and portions of the second LDD implanted regions 126 under the second gate 118 receiving a lower dose of carbon, which may provide the first MOS transistor 104 and the second MOS transistor 106 with desired levels of Iddq, and results in portions of the first LDD implanted regions 124 not under the first gate 112 and portions of the second LDD implanted regions 126 not under the second gate 118 receiving a higher dose of carbon, which may provide the first MOS transistor 104 and the second MOS transistor 106 with desired levels of threshold mismatch, compared to similar transistors formed without carbon co-implantation or only with angled carbon co-implantation.

Figure 2A:
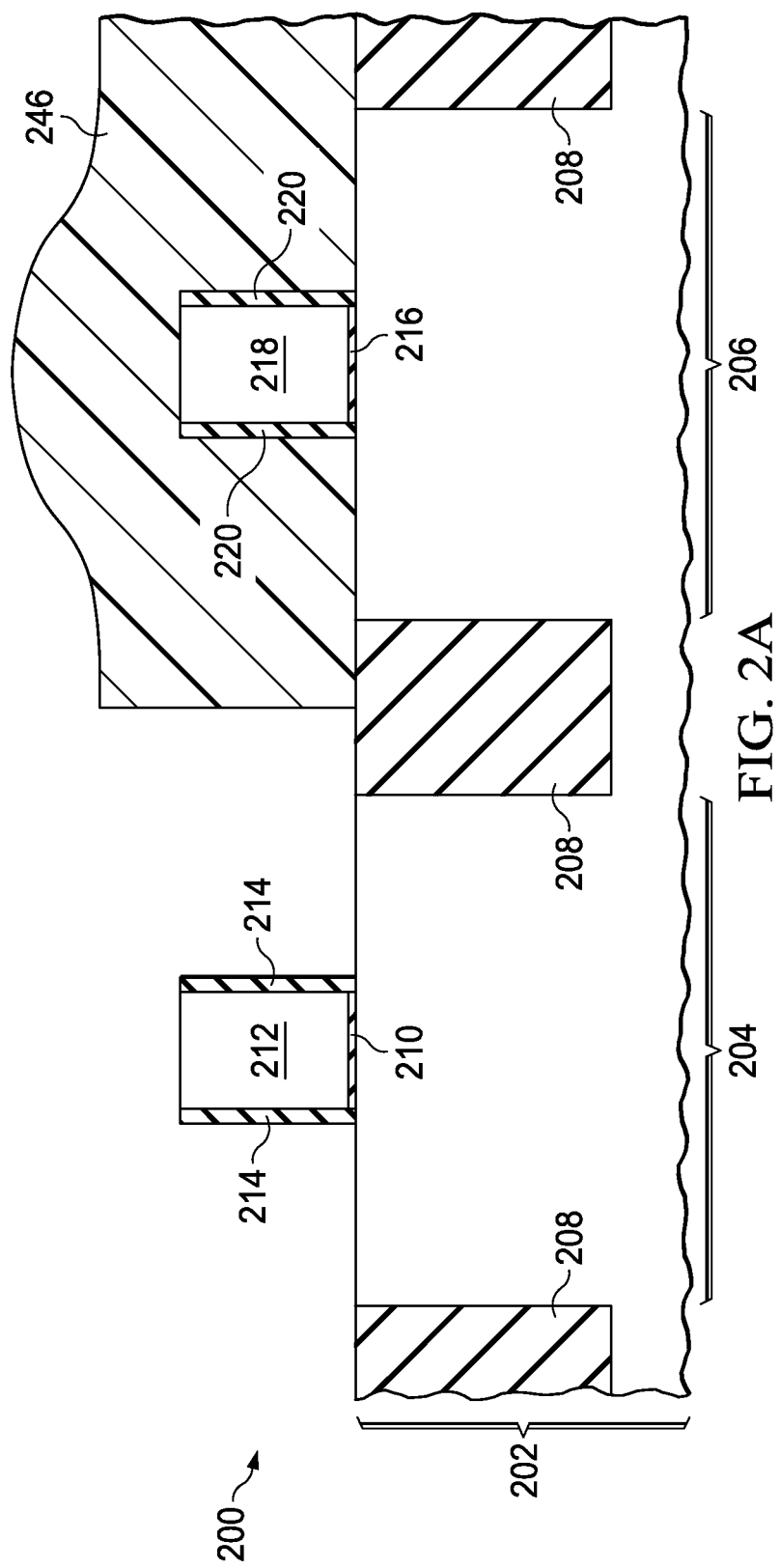
FIG. 2A through FIG. 2F are cross sections of an integrated circuit depicted in successive stages of fabrication.

FIG. 2A through FIG. 2F are cross sections of an integrated circuit depicted in successive stages of fabrication. Referring to FIG. 2A, the integrated circuit 200 is formed in and on a semiconductor substrate 202 as described in reference to FIG. 1A. The integrated circuit includes a first MOS transistor 204 and a second MOS transistor 206 having a same polarity as the first MOS transistor 204. Field oxide 208 may be formed at a top surface of the substrate 202 to laterally isolate the first MOS transistor 204 and the second MOS transistor 206, for example, as described in reference to FIG. 1A.

The first MOS transistor 204 includes a first gate dielectric layer 210 formed at the top surface of the substrate 202 and a first gate 212 formed over the first gate dielectric layer 210. Optional first spacers 214 may be formed on lateral surfaces of the first gate 212. Similarly, the second MOS transistor 206 includes a second gate dielectric layer 216 formed at the top surface of the substrate 202 and a second gate 218 formed over the second gate dielectric layer 216, and may include optional second spacers 220 formed on lateral surfaces of the second gate 218. The first gate dielectric layer 210 and the second gate dielectric layer 216 may be formed concurrently. The first gate 212 and the second gate 218 may be formed concurrently. The first spacers 214 and the second spacers 220 may be formed concurrently.

A first LDD implant mask 246 is formed over the integrated circuit 200 so as to expose the first MOS transistor 204 and cover the second MOS transistor 206. The first LDD implant mask 246 may be, for example, photoresist formed by a photolithographic operation.

Figure 2B:
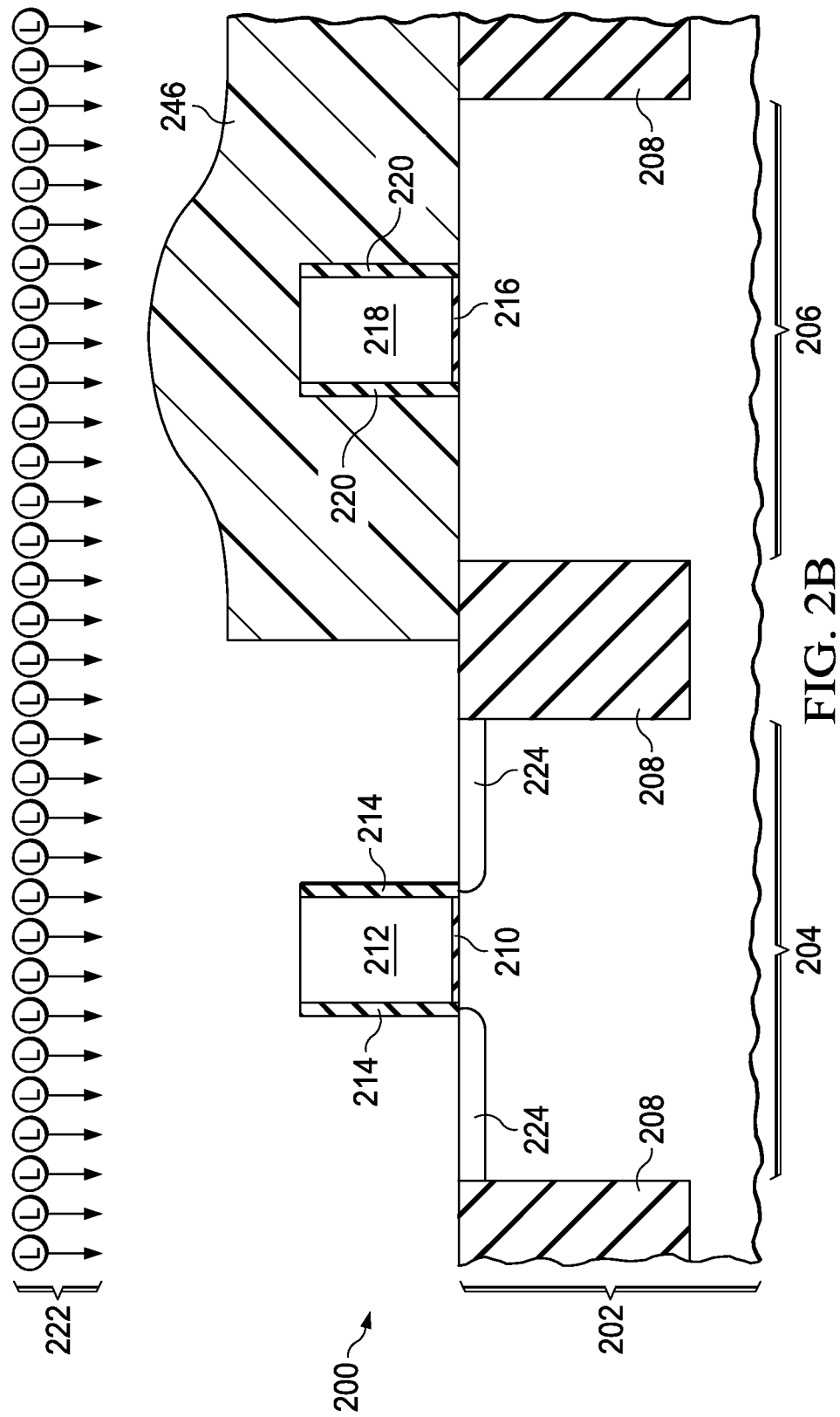

Referring to FIG. 2B, LDD dopants 222 are implanted into the substrate 202 to form first LDD implanted regions 224 adjacent to the first gate 212. The LDD dopants 222 are blocked from the substrate 202 adjacent to the second gate 218 by the first LDD implant mask 246. The LDD dopants 222 may have the parameters and be implanted as described in reference to FIG. 1A.

Figure 2C:
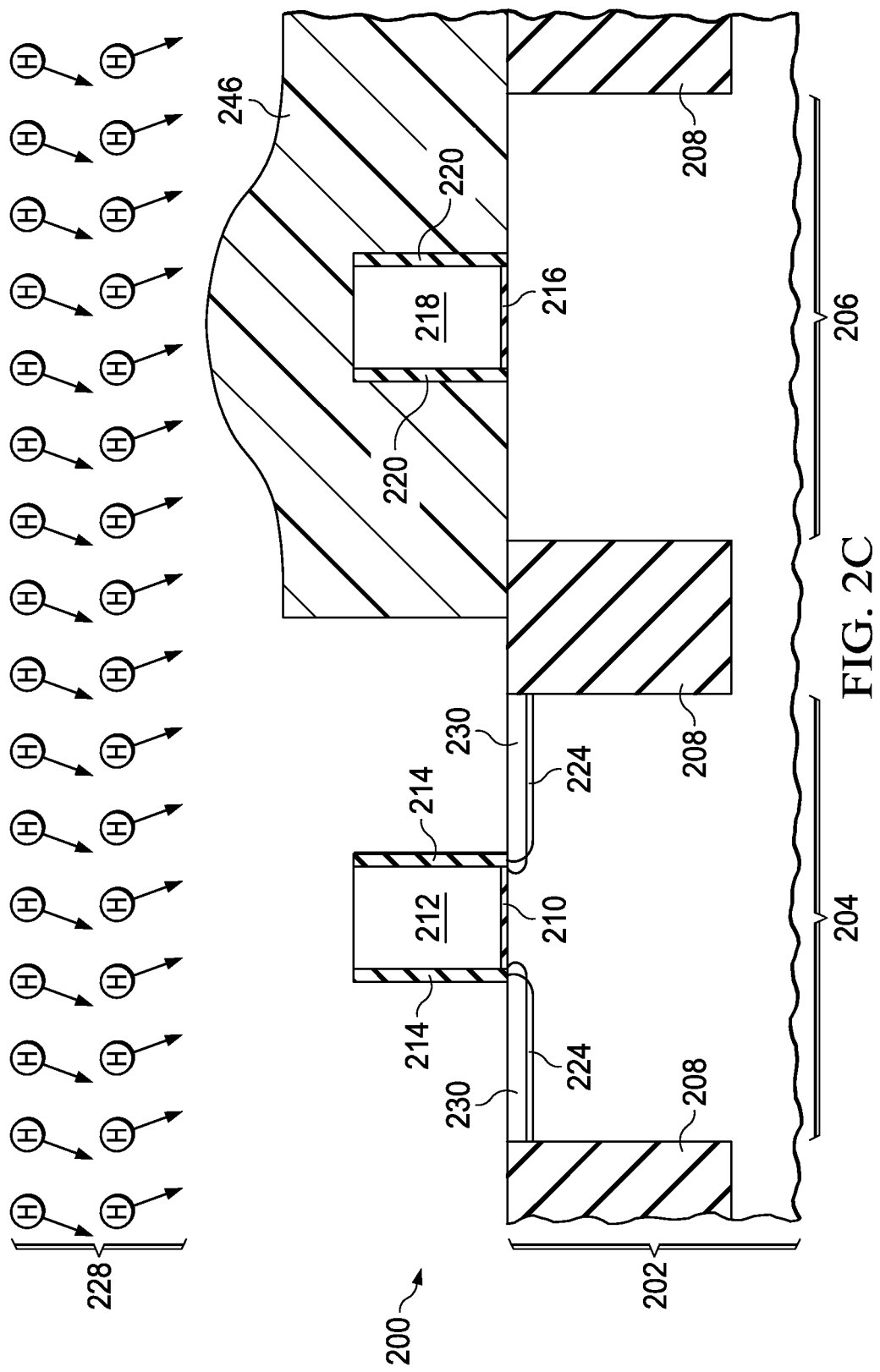
Figure 2D:
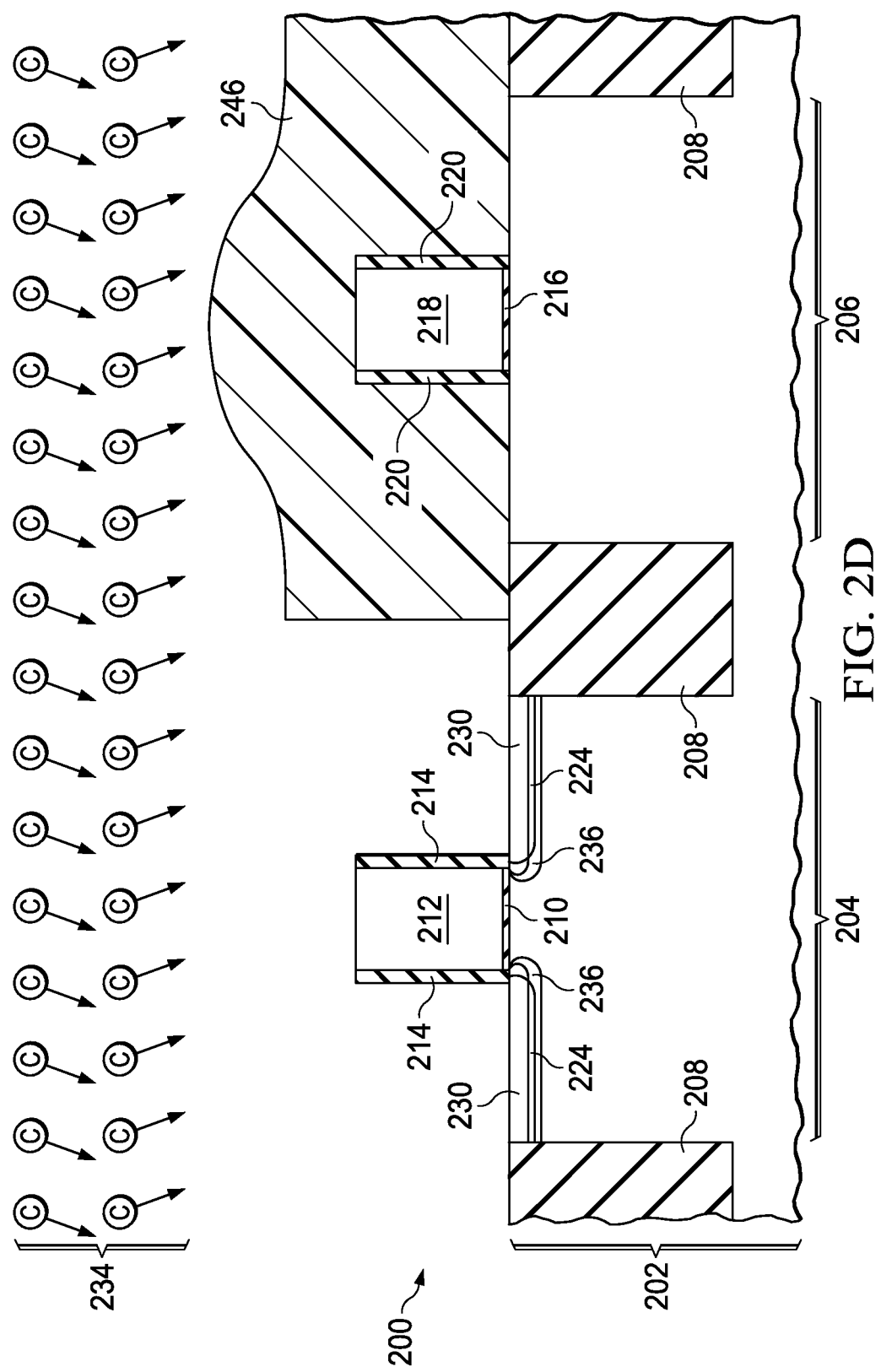

Referring to FIG. 2C, first halo dopants 228 are implanted at an angle into the substrate 202 to form first halo implanted regions 230 adjacent to the first gate 212, extending past the first LDD implanted regions 224 under the first gate 212 and/or first spacers 214. The first halo dopants 228 are blocked from the substrate 202 adjacent to the second gate 218 by the first LDD implant mask 246. The first halo dopants 228 may have the parameters and be implanted as described in reference to FIG. 1B Referring to FIG. 2D, an angled carbon implant is performed in which carbon ions 234 are implanted at an angle of 10 to 35 degrees and a dose of $1\times10^{14}$ to $cm^{-2}$ to $1\times10^{15}$ $cm^{-2}$ at an energy of 3 keV to 12 keV into the substrate 202 to form angled carbon implanted regions 236 adjacent to the first gate 212, extending past the first LDD implanted regions 224 under the first gate 212 and/or first spacers 214. The angled carbon implant may be performed in two or four steps with equal doses, rotated around a perpendicular to the top surface of the substrate 202, so that the angled carbon implanted regions 236 are substantially symmetric about the first gate 212. The carbon ions of the angled carbon implant are blocked from the substrate 202 adjacent to the second gate 218 by the first LDD implant mask 246.

Figure 2E:
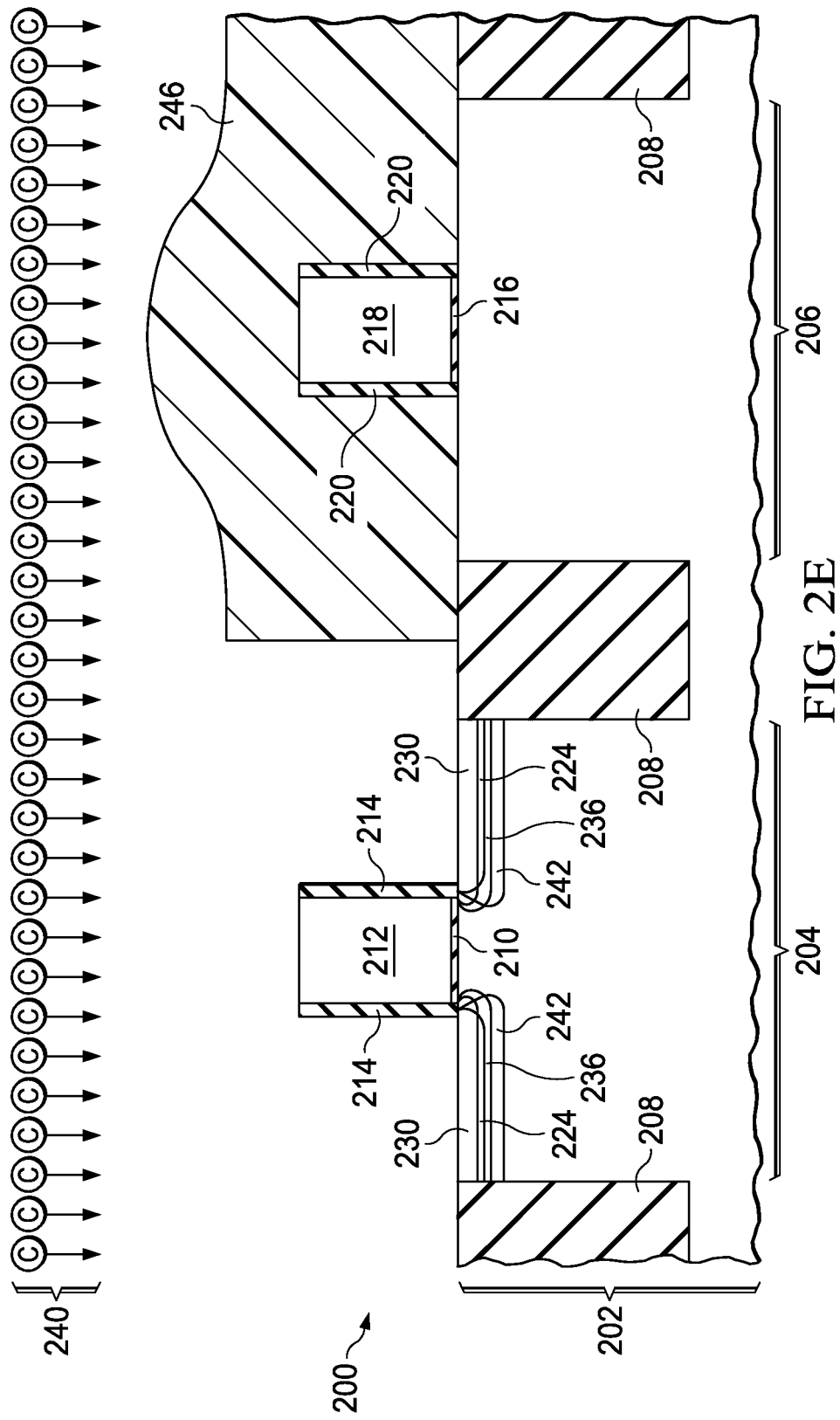

Referring to FIG. 2E, a zero-degree carbon implant is performed in which carbon ions 240 are implanted substantially perpendicular to the top surface of the substrate 202 at a dose of $1\times10^{14}$ $cm^{-2}$ to $8\times10^{14}$ $cm^{-2}$ at an energy of 3 keV to 12 keV into the substrate 202 to form non-angled carbon implanted regions 242 adjacent to the first gate 212. The carbon ions of the zero-degree carbon implant are blocked from the substrate 202 adjacent to the second gate 218 by the first LDD implant mask 246. The first LDD implant mask 246 is subsequently removed, for example, by exposing the integrated circuit 100 to an oxygen containing plasma, followed by a wet cleanup to remove any organic residue from an existing top surface of the integrated circuit 100.

Figure 2F:
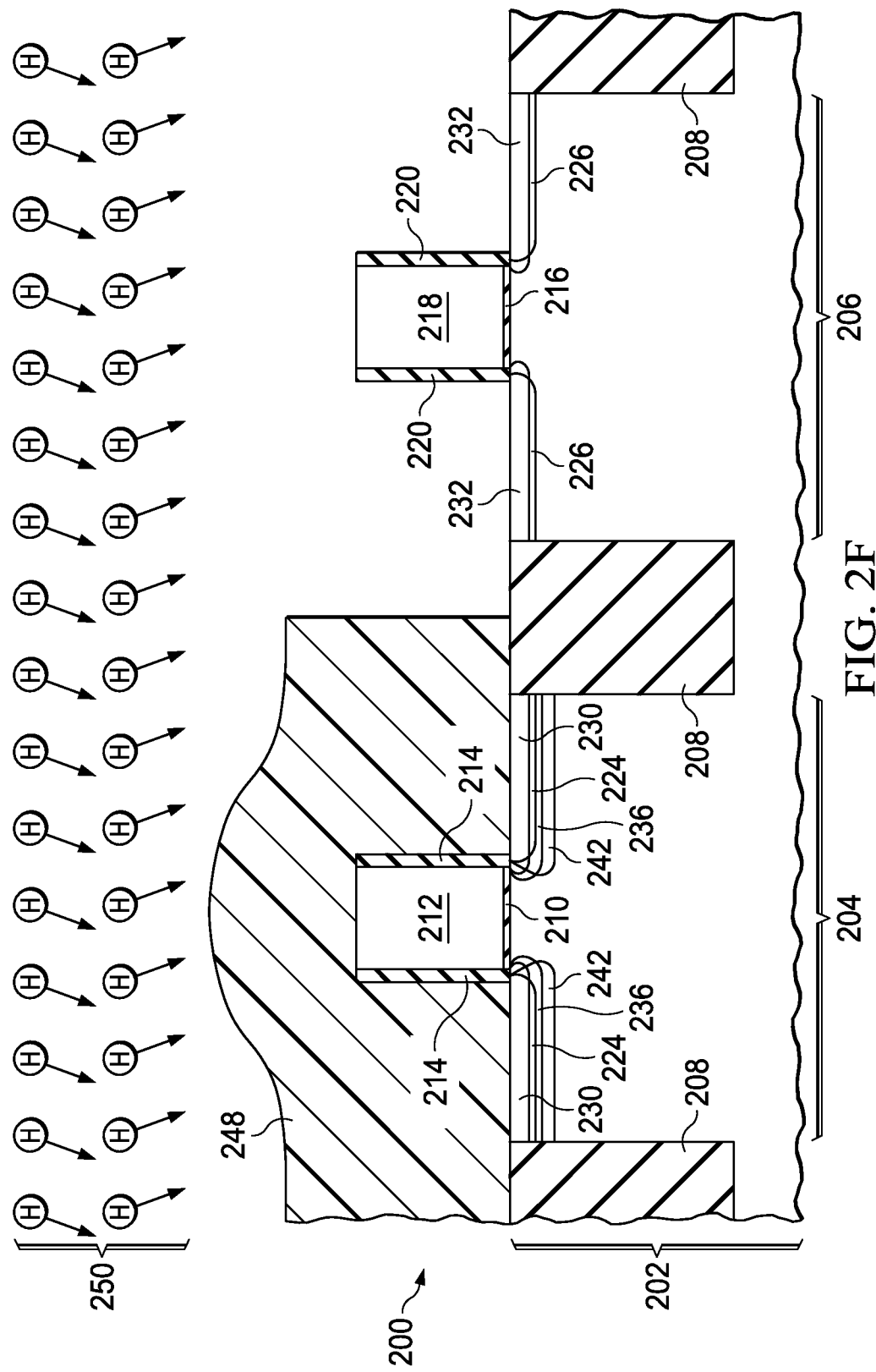

Referring to FIG. 2F, a second LDD implant mask 248 is formed over the integrated circuit 200 so as to expose the second MOS transistor 206 and cover the first MOS transistor 204. The second LDD implant mask 248 may be formed in a similar manner to the first LDD implant mask 246, as described in reference to FIG. 2A. Second halo dopants 250 are implanted at an angle into the substrate 202 to form second halo implanted regions 232 adjacent to the second gate 218 and extending under the second gate 218 and/or second spacers 220. The second halo dopants 250 are blocked from the substrate 202 adjacent to the first gate 212 by the second LDD implant mask 248. The second halo dopants 250 may have different dose and energy values from the first halo dopants 228 described in reference to FIG. 1B, so as to desirably provide different operation parameters in the second MOS transistor 206 compared to the first MOS transistor 204. Second LDD implanted regions 226 may be formed in the substrate 202 adjacent to the second gate 218 as described in reference to FIG. 1B. Dose and energy parameters used to form the second LDD implanted regions 226 may be different from the dose and energy parameters used to form the first LDD implanted regions 224, so as to further provide different operation parameters in the second MOS transistor 206 compared to the first MOS transistor 204.

Fabrication of the integrated circuit 200 includes one or more anneal operations to activate the dopants in the first LDD implanted regions 224, the first halo implanted regions 230 and the second halo implanted regions 232. Co-implanting carbon in an angled implant and a zero-degree implant may provide the first MOS transistor 204 with desired levels of threshold mismatch and Iddq. Blocking the carbon co-implants from the second MOS transistor 206 may desirably provide different operation parameters in the second MOS transistor 206 compared to the first MOS transistor 204.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
    providing a substrate comprising a semiconductor;
    forming a lightly doped drain (LDD) implant masking layer;
    using the LDD implant masking layer, implanting LDD dopants into said substrate to form LDD implanted regions adjacent to a gate in an area for a metal oxide semiconductor (MOS) transistor;
    using the LDD implant masking layer, implanting halo dopants at an angle into said substrate to form halo implanted regions adjacent to said gate and extending past said LDD implanted regions;
    using the LDD implant masking layer, performing an angled carbon implant which implants carbon ions at an angle into said substrate to form angled carbon implanted regions adjacent to said gate and extending past said LDD implanted regions at a surface of the substrate;
    using the LDD implant masking layer, performing a plurality of zero-degree carbon implants which implant carbon ions at different doses and/or energies substantially perpendicular to said top surface of the substrate into said substrate to form non-angled carbon implanted regions adjacent to said gate; and
    after performing the plurality of zero-degree carbon implants, removing the LDD implant masking layer.

2. The method of claim 1, in which said carbon ions of said angled carbon implant are implanted at an angle of 10 to 35 degrees in two or four steps with equal doses, rotated around a perpendicular to said top surface of said substrate so that said angled carbon implanted regions are substantially symmetric about said gate.

3. The method of claim 1, in which said carbon ions of said angled carbon implant have a total dose of $1\times10^{14}$ cm$^{-2}$ to $1\times10^{15}$ cm$^{-2}$.

4. The method of claim 1, in which said carbon ions of said angled carbon implant have an energy of 3 keV to 12 keV.

5. The method of claim 1, in which said carbon ions of said zero-degree carbon implant have a total dose of $1\times10^{14}$ cm$^{-2}$ to $8\times10^{14}$ cm$^{-2}$.

6. The method of claim 1, in which said carbon ions of said zero-degree carbon implant have an energy of 3 keV to 12 keV.

7. The method of claim 1, in which said MOS transistor is an n-channel MOS transistor.

8. The method of claim 7, in which said halo dopants include boron.

9. The method of claim 1, in which said MOS transistor is a p-channel MOS transistor.

10. The method of claim 9, in which said halo dopants include phosphorus.

11. A method of forming an integrated circuit, comprising the steps of:
providing a substrate comprising a semiconductor; and
performing a first lightly doped drain (LDD) implant step including the steps of:
forming a first LDD implant mask over said integrated circuit so as to expose a first MOS transistor and cover a second MOS transistor, said second MOS transistor having a same polarity as said first MOS transistor;
implanting LDD dopants into said substrate to form first LDD implanted regions adjacent to a first gate of said first MOS transistor, such that said LDD dopants are blocked from said second MOS transistor by said first LDD implant mask;
implanting first halo dopants at an angle into said substrate to form first halo implanted regions adjacent to said first gate and extending past said first LDD implanted regions, such that said first halo dopants are blocked from said second MOS transistor by said first LDD implant mask;
performing an angled carbon implant which implants carbon ions at an angle into said substrate to form angled carbon implanted regions adjacent to said first gate and extending past said first LDD implanted regions, such that said carbon ions of said angled carbon implant are blocked from said second MOS transistor by said first LDD implant mask; and
performing a plurality of zero-degree carbon implants which implant carbon ions at different doses and/or energies substantially perpendicular to said top surface of the substrate into said substrate to form non-angled carbon implanted regions adjacent to said first gate, such that said carbon ions of said zero-degree carbon implant are blocked from said second MOS transistor by said first LDD implant mask;
performing a second lightly doped drain (LDD) implant step including the steps of:
forming a second LDD implant mask over said integrated circuit so as to cover said first MOS transistor and expose said second MOS transistor; and
implanting second halo dopants at an angle into said substrate to form second halo implanted regions adjacent to a second gate of said second MOS transistor, such that said second halo dopants are blocked from said first MOS transistor by said second LDD implant mask.

12. The method of claim 11, in which said carbon ions of said angled carbon implant are implanted at an angle of 10 to 35 degrees in two or four steps with equal doses, rotated around a perpendicular to said top surface of said substrate so that said angled carbon implanted regions are substantially symmetric about said first gate.

13. The method of claim 11, in which said carbon ions of said angled carbon implant have a total dose of $1\times10^{14}$ cm$^{-2}$ to $1\times10^{15}$ cm$^{-2}$.

14. The method of claim 11, in which said carbon ions of said angled carbon implant have an energy of 3 keV to 12 keV.

15. The method of claim 11, in which said carbon ions of said zero-degree carbon implant have a total dose of $1\times10^{14}$ cm$^{-2}$ to $8\times10^{14}$ cm$^{-2}$.

16. The method of claim 11, in which said first MOS transistor and said second MOS transistor are n-channel MOS transistors.

17. The method of claim 16, in which said first halo dopants include boron.

18. The method of claim 11, in which said first MOS transistor and said second MOS transistor are p-channel MOS transistors.

19. The method of claim 18, in which said first halo dopants include phosphorus.

20. The method of claim 11, in which a dose of said second halo dopants is different from a dose of said first halo dopants.

* * * * *